US012756970B2

(12) United States Patent
Margalit

(10) Patent No.: US 12,756,970 B2
(45) Date of Patent: Oct. 6, 2026

(54) SYSTEM AND METHOD FOR GENERATING AN AUDIO SIGNAL

(71) Applicant: SONICEDGE LTD., Shoham (IL)

(72) Inventor: Mordehai Margalit, Zichron Yaaqov (IL)

(73) Assignee: Sonicedge Ltd., Shoham (IL)

( * ) Notice: Subject to any disclaimer, the term of this patent is extended or adjusted under 35 U.S.C. 154(b) by 418 days.

(21) Appl. No.: 18/192,722

(22) Filed: Mar. 30, 2023

(65) Prior Publication Data

US 2023/0353933 A1 Nov. 2, 2023

Related U.S. Application Data

(60) Provisional application No. 63/415,763, filed on Oct. 13, 2022, provisional application No. 63/327,478, filed on Apr. 5, 2022.

(51) Int. Cl.

| | |
|---|---|
| ***H04R 1/28*** | (2006.01) |
| ***B81B 7/02*** | (2006.01) |
| ***H04R 19/02*** | (2006.01) |

(52) U.S. Cl.

CPC ............. *H04R 1/2803* (2013.01); *B81B 7/02* (2013.01); *H04R 19/02* (2013.01); *B81B 2201/0257* (2013.01); *H04R 2201/003* (2013.01); *H04R 2217/03* (2013.01)

(58) Field of Classification Search

CPC H04R 1/2803; H04R 19/02; H04R 2201/003; H04R 2217/03; B81B 7/02; B81B 2201/0257

USPC ............ 381/190, 396, 174, 191; 438/51, 53; 29/594

See application file for complete search history.

(56) References Cited

U.S. PATENT DOCUMENTS

| | | | | |
|---|---|---|---|---|
| 8,861,752 | B2 | 10/2014 | Margalit | |
| 2014/0340366 | A1* | 11/2014 | Poulsen | G06F 3/043 345/177 |
| 2015/0304753 | A1* | 10/2015 | Loeppert | H04R 1/086 381/111 |
| 2016/0277838 | A1 | 9/2016 | Kupershmidt | |
| 2016/0277845 | A1 | 9/2016 | Kupershmidt | |
| 2016/0360320 | A1 | 12/2016 | Margalit | |
| 2016/0360321 | A1 | 12/2016 | Margalit | |
| 2021/0274291 | A1* | 9/2021 | Angelskår | G01B 9/02051 |
| 2022/0340409 | A1* | 10/2022 | Fu | H04R 31/003 |
| 2022/0408208 | A1* | 12/2022 | Chen | H04R 17/02 |

* cited by examiner

*Primary Examiner* — Norman Yu

(74) *Attorney, Agent, or Firm* — Manelli Selter PLLC; Edward Stemberger

(57) ABSTRACT

Techniques described herein generally relate to generating an audio signal with a speaker. In some examples, a speaker device is described that includes a membrane and a shutter and driver device is configured to receive an audio signal, modulate it and generate electric signals to operate the speaker and generate an acoustic audio signal.

13 Claims, 14 Drawing Sheets

SYSTEM AND METHOD FOR GENERATING AN AUDIO SIGNAL

TECHNICAL FIELD

The present disclosure generally relates to systems and methods for generating an audio signal. In some examples the system and methods of generating an audio signal are applied in a mobile, wearable, or portable device. In other examples the system and methods of generating an audio signal are applied in earphones, headsets, hearables, or hearing aids.

BACKGROUND OF THE DISCLOSURE

U.S. Pat. No. 8,861,752 describes a picospeaker which is a novel sound generating device and a method for sound generation. The picospeaker creates an audio signal by generating an ultrasound acoustic beam which is then actively modulated. The resulting modulated ultrasound signal has a lower acoustic frequency sideband which corresponds to the frequency difference between the frequency of the ultrasound acoustic beam and the modulation frequency. US 20160360320 and US 20160360321 describe MEMS architectures for realizing the picospeaker. US 20160277838 describes one method of implementation of the picospeaker using MEMS processing. US 2016277845 describes an alternative method of implementation of the picospeaker using MEMS processing. The extract the optimal performance of the MEMS picospeaker, the device needs to be placed in a package and connected electrically, mechanically and acoustically to the audio device. In this disclosure we describe examples of packaging the MEMS device using the unique features of the modulated ultrasound picospeaker.

Glossary

"acoustic signal"—as used in the current disclosure means a mechanical wave traversing either a gas, liquid or solid medium with any frequency or spectrum portion between 10 Hz and 10,000,000 Hz.

"audio" or "audio spectrum" or "audio signal"—as used in the current disclosure means an acoustic signal or portion of an acoustic signal with a frequency or spectrum portion between 10 Hz and 20,000 Hz.

"speaker" or "pico speaker" or "micro speaker" or "nano speaker"—as used in the current disclosure means a device configured to generate an acoustic signal with at least a portion of the signal in the audio spectrum.

"membrane"—as used in the current disclosure means a flexible structure constrained by at least two points.

"blind"—as used in the current disclosure means a structure with at least one acoustic port through which an acoustic wave traverses with low loss.

"shutter"—as used in the current disclosure means a structure configured to move in reference to the blind and increase the acoustic loss of the acoustic port or ports.

"acoustic medium"—as used in the current disclosure means any of but not limited to; a bounded region in which a material is contained in an enclosed acoustic cavity; an unbounded region where in which a material is characterized by a speed of sound and unbounded in at least one dimension. Examples of acoustic medium include but are not limited to; air; water; ear canal; closed volume around ear; air in free space; air in tube or another acoustic channel.

"active demodulation"—as used in the current disclosure means any of but not limited to frequency shift of an ultrasound acoustic signal by modulation of the acoustic impedance of at least one part of the MEMS speaker.

SUMMARY

Some embodiments of the present disclosure may generally relate to a speaker device that includes at least one membrane and shutter. The membrane is positioned in a first plane and configured to oscillate along a first directional path and at a first frequency effective to generate an ultrasonic acoustic signal. The shutter is positioned in a second plane that is substantially separated from the first plane. The shutter is configured to modulate the ultrasonic acoustic signal such that an audio signal is generated. The speaker device is connected to a driver device where the driver device supplies at least two electrical signals to operate the speaker device at least one membrane and shutter respectively. The driver device receives an input audio signal from which it generates a modulated audio signal to operate the membrane and generate an ultrasonic modulated signal. The driver further operates the shutter at the modulation frequency to demodulate the ultrasonic modulated signal and generate an acoustic audio signal.

Other embodiments of the present disclosure may generally relate to a speaker device comprising an array of membranes and shutters. The array of membranes and shutters operate either independently or driven by together by the driver device. In one example, the driving device is a semiconductor integrated circuit which includes; a controller; a charge pump configured to generate a high voltage signal; a switching unit configured to modulate the high voltage signal. The driving device receives a digital sound data stream and an operating voltage and outputs driving signals for the membrane, and shutter. In some embodiments the membrane and shutter operate asynchronously and or independently of each other at one or more frequencies. In other embodiments the membrane and shutter operate synchronously at the same frequency. In the synchronous mode of operation, the amplitude of the audio signal is controlled by any of but not limited to; the relative phase of the membrane and shutter operation; the amplitude of the shutter operation; the amplitude of the membrane operation; any combination of these.

In further embodiments of the present disclosure the speaker device is attached to a substrate, air flow from the membrane and shutter operation is channeled to acoustic ports, three or more wire bonds connect the speaker device layers to conductive pads on one side of the substrate and to pads on the second side of the substrate, and a lid attached to the top side of the substrate and covering the speaker device and wire bonds provides acoustic functionality and increase the robustness and resilience of the speaker device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are therefore not to be considered limiting of its scope, the disclosure will be described with additional specificity and detail through use of the accompanying drawings.

DETAILED DESCRIPTION

Figure 1:
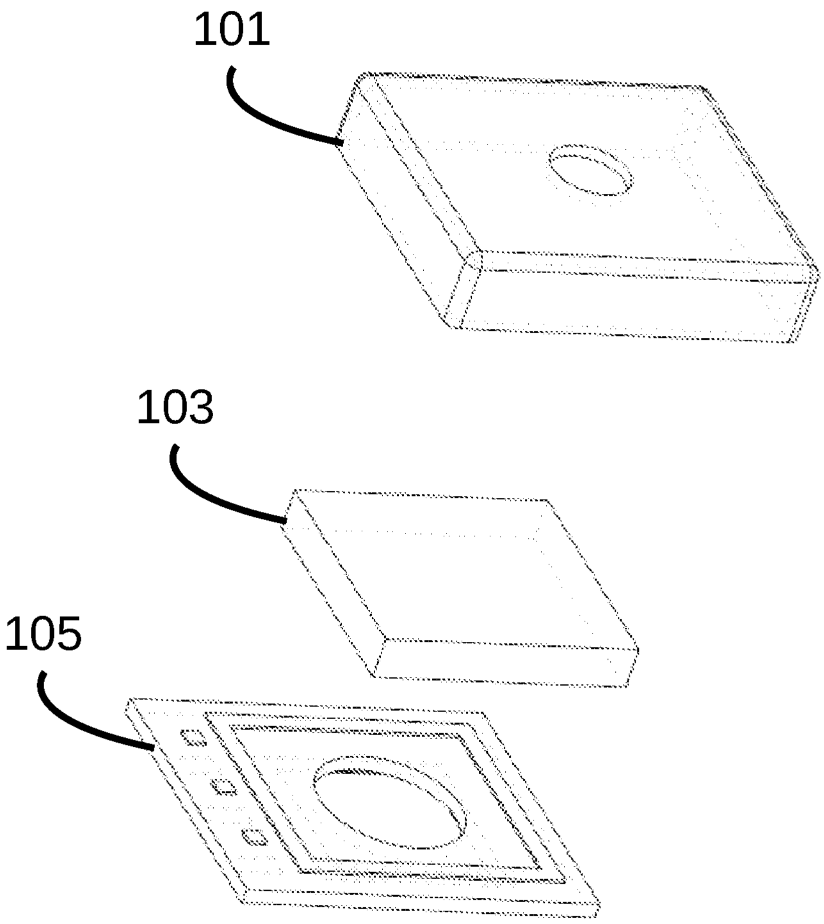
FIG. 1 is an example of a transposition of the speaker device components.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other examples may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure. This disclosure is drawn, inter alia, to methods, apparatus, computer programs, and systems of generating an audio signal.

In some examples, a speaker device is described that includes a membrane and a shutter. The membrane is configured to oscillate along a first directional path and at a combination of frequencies with at least one frequency effective to generate an ultrasonic acoustic signal. A shutter and blind are positioned proximate to the membrane. In one non limiting example the membrane, the blind, and the shutter may be positioned in a substantially parallel orientation with respect to each other. In other examples the membrane, the blind, and the shutter may be positioned in the same plane and the acoustic signal is transmitted along acoustic channels leading from the membrane to the shutter.

In a further example the modulator and or shutter are composed of more than one section.

In some embodiments, the membrane is driven by an electric signal that oscillates at a frequency Ω and hence moves at b Cos (2π*Ωt), where b is the amplitude of the membrane movement, and t is time. The electric signal is further modulated by a portion that is derived from an audio signal a(t). The acoustic signal generated by the membrane is characterized as:

$$s(t) = b\ a(t)\ \mathrm{Cos}(2\pi^{*}\Omega t) \tag{1}$$

Applying a Fourier transform to Equation (1) results in a frequency domain representation $$S(f) = b/2 * [A(f-\Omega) + A(f+\Omega)] \tag{2}$$

Where A(f) is the spectrum of the audio signal. Equation (2) describes a modulated audio signal with an upper and lower side band around a carrier frequency of Ω (Double Side Band-DSB). Applying to the acoustic signal of Equation (1) an acoustic modulator operating at frequency Q results in $$S(t) = b\ a(t)\ \mathrm{Cos}(2\pi*\Omega t)(l + m\ \ \mathrm{Cos}(2\pi*\Omega t)) \tag{3}$$

Where I is the loss of the modulator and m is the modulation function and due to energy conservation l+m<1. In the frequency domain $$S'(f) = b/4 * [m\ A(f) + m\ A(f+2\Omega) + A(f-\Omega) + A(f+\Omega)] \tag{4}$$

Where b/4*m A(f) is an audio signal. The remaining terms are ultrasound signals where m A(f+2Ω) is at twice the modulation frequency and A(f−Ω)+A(f+Ω) is the original unmodulated signal. Additional acoustic signals may be present due to any but not limited to the following; ultrasound signal from the shutter movement; intermodulation signals due to nonlinearities of the acoustic medium; intermodulation signals due to other sources of nonlinearities including electronic and mechanical.

In one example we use the term "active demodulation" to describe the above functions where a frequency shift of an ultrasound acoustic signal is facilitated by modulation of the acoustic impedance of at least one part of the MEMS speaker.

In one example a speaker device includes at least three electro static active layers or membrane layers; a membrane layer as described in equation (1) which receives a first voltage signal, a shutter or modulator layer as described in equation (3) which receives a second voltage signal and a ground layer. In an alternative example a speaker may include at least two piezo electric active layers; a membrane layer and shutter layer where each layer receives a voltage signal on one side of a membrane and a ground signal on a second side of the membrane.

FIG. 1 is an example of a speaker device comprising of at least but not limited to a lid (101) a MEMS speaker unit (103) and a substrate (105). In a further example the lid includes at least one acoustic port. Lid materials include but are not limited to; metals; liquid crystal polymer; Nickel; Nickel alloys; Copper; Copper alloys; Aluminum; Aluminum alloys; polymers; Silicon; glass or combinations of these. The lid at least covers the MEMS speaker unit (103) and connects to a substrate (105). Example of connections include but are not limited to adhesive; epoxy; Silicone; solder; metal welding or brazing. In one example the connection of the lid to a substrate is water tight. In a further example the connection of the lid to a substrate has a total leakage that when subjected to 1 Pascal of pressure difference would enable an airflow of any off but not limited to; less than 1 $mm^3$/sec; less than 10 $mm^3$/sec; less than 100 $mm^3$/sec. The MEMS speaker unit (103) is configured as an electro static device with at least three electrical connections or pad or as a pizeo electric device with at least three electrical connections or at least four electrical connections or bond pads. The MEMS speaker unit (103) has at least two acoustic ports on opposing side of the MEMS speaker unit (103). The MEMS speaker unit (103) is assembled on the substrate (105). Examples of substrate (105) materials include but are not limited to; PCB laminates; ceramic substrate; Aluminum Oxide substrate; metal substrate; Aluminum substrates; Aluminum alloys substrate; Nickel substrate; Nickel alloy substrate; Copper substrate; Copper alloy substrate; organic substrates or combinations of such materials and substrates. In one example a substrate (105) includes conducting traces positioned on non-conducting layers. Conducting traces are made from any of but not limited to Copper; Copper alloys; Aluminum; Aluminum alloys; Nickel; Nickel Alloys; Silver; Silver alloys; Gold; Gold alloys or combination of these. In a further example a substrate includes electrical vias connecting top side pads or electrical traces to bottom side pads or electrical traces. In a further example a substrate includes at least a number of pads corresponding to the electrical connections of the MEMS speaker unit (103). An electrical connection between substrate (105) pads and MEMS speaker unit (103) pads is facilitated with bond wires. Examples of bond wires include copper; gold; Aluminum or combinations of such bond wires. In one example a MEMS speaker device (103) is attached to a substrate (105) by any of but not limited to adhesive; epoxy; solder; bonding; eutectic bonding; laser welding. In a further example a substrate includes a liner composed of metal; epoxy or solder mask trace outlining the MEMS speaker unit circumference and the MEMS speaker unit is attached to the liner. In a further example the liner is composed of any of but not limited to such materials and has a total height of at least any of but not limited to at least 10 micron; at least 20 micron; at least 40 micron; at least 60 micron at least 100 micron. In a further example a substrate includes bottom pads configured to be assembled on a PCB or flex PCB using standard SMD assembly.

Figure 2A:
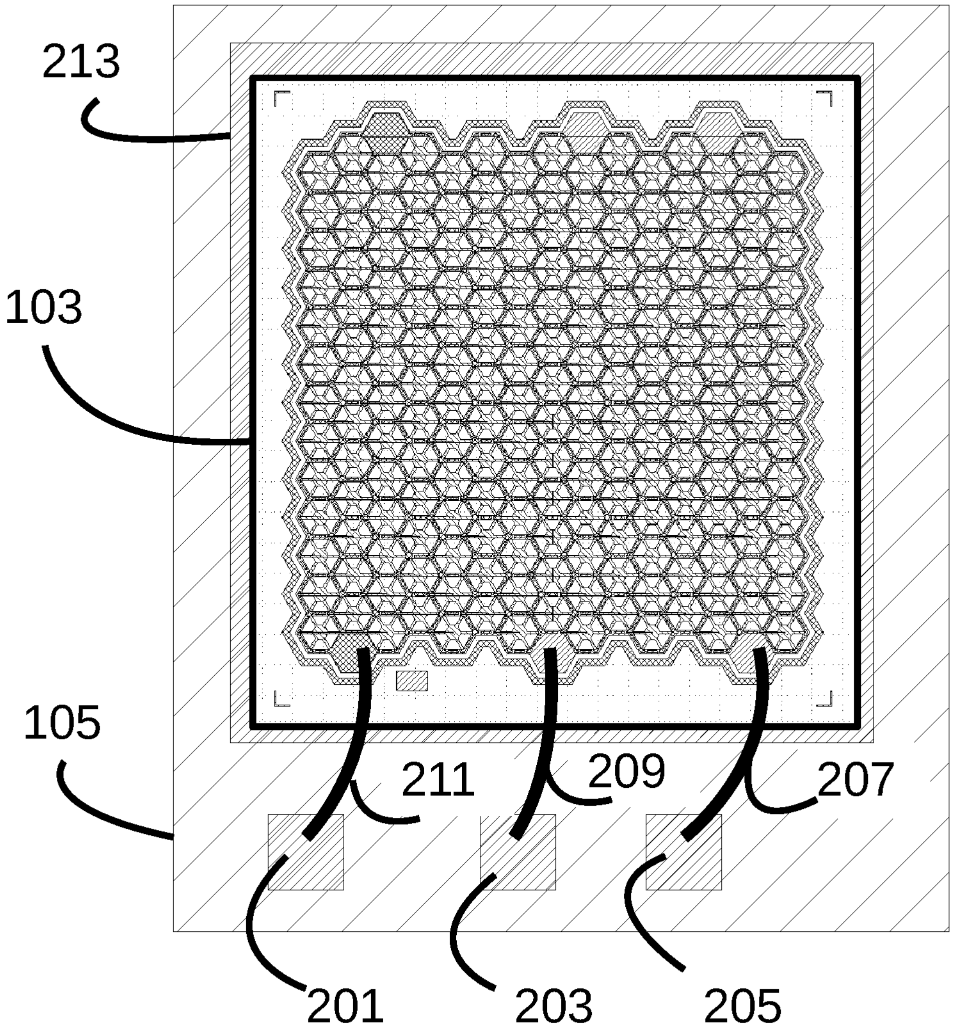
FIG. 2A is an example of a top view of the speaker device with the lid removed.

FIG. 2A is an example of a top view of the speaker device with the lid removed. A MEMS speaker unit (103) is assembled on the substrate (105). In one example a top side trace (213) is deposited on the substrate (105) tracing the circumference of the MEMS speaker unit (103). In one example the top side trace (213) extends at least any of but not limited to at least 10 micron; at least 50 micron; at least 100 micron; to either side of the MEMS speaker unit (103) circumference. The top side trace (213) is composed of any of but not limited to metal; copper; copper alloys; solder mask; epoxy; adhesive; polymer; thermosetting polymer; Silicone or combinations of materials or layers of these. Bond pads (201, 203, 205) are deposited on the substrate as described previously. Wire bonds (207, 209, 211) connect bond pads on MEMS speaker unit (103) to the bond pads (201, 203, 205). While FIG. 2A is an example depicting 3 bond pads, other examples include any of but not limited to; 4; 7; 9; less than 20; less than 50 bond pads.

Figure 2B:
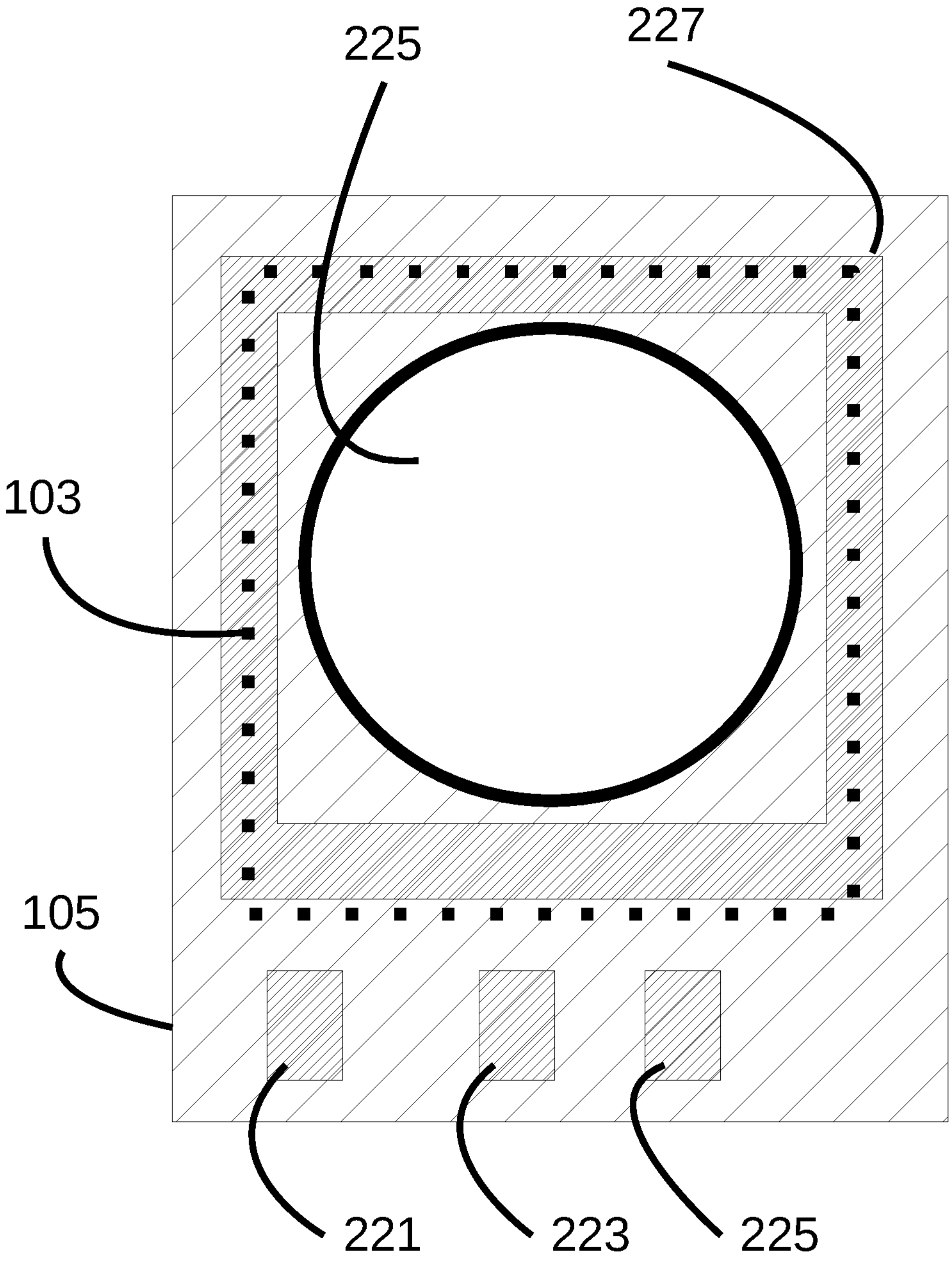
FIG. 2B is an example of a bottom view of the speaker device substrate.

FIG. 2B is an example of a bottom view of the speaker device substrate (105). In one example a substrate has back side pads (221, 223, 225) deposited on its back side. The number of back side pads (221, 223, 225) corresponds to the number of front side bond pads (FIG. 2A 201, 203, 205). In a further example a backside trace (227) outlines a backside acoustic port (225). In a further example, the back side trace has no defined spatial relation to the MEMS speaker unit (dotted line of 103). The backside acoustic port (225) is located below the MEMS speaker unit. In a further example the ratio of the area of the backside acoustic port to the area of the MEMS speaker device is any of but not limited to at least ½; at least ¾; at least ¼; at least 0.1; at least 0.2. In one example the acoustic port shape is circular. A backside trace serves as a means to bond or solder the area around an acoustic port (225) and to seal the acoustic port (225) to an underlying substrate or audio device.

Figure 2C:
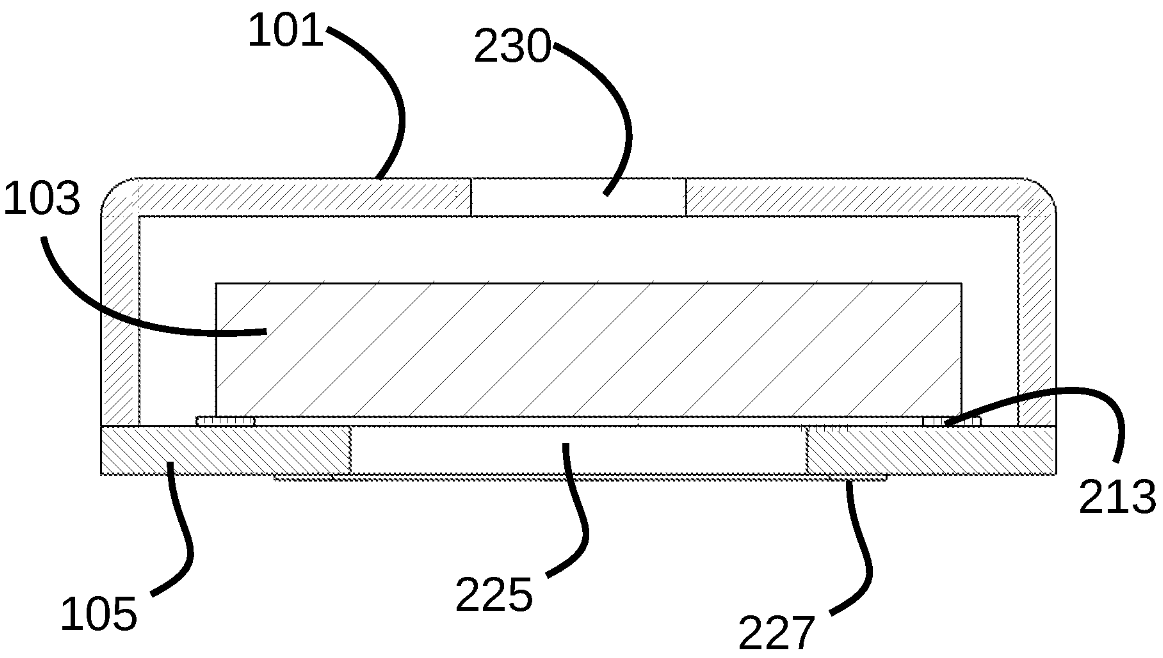
FIG. 2C is an example of side view of the speaker device.

FIG. 2C is an example of a side view of the speaker device. In one example, a MEMS speaker unit (103) is assembled on a substrate (105). In a further example a top side trace (213) is deposited between the MEMS speaker unit (103) and substrate (105). The top side trace (213) elevates the MEMS speaker unit (103) from the substrate and can accommodate an acoustic cavity between the bottom acoustic port (225) and the MEMS speaker unit (103). In one example, a top side acoustic port (230) provides an acoustic connection between the volume defined by the lid and substrate and the air external to the speaker device. One or more top side holes (230) can have an area smaller than 1 $mm^2$, 2 $mm^2$, 3 $mm^2$, 6 $mm^2$. In a further example the top side hole (230) is circular. The thickness of the substrate (103) is any of but not limited to smaller than 0.1 mm, smaller than 0.2 mm, smaller than 0.25 mm, smaller than 0.5 mm. The thickness of the lid (101) is any of but not limited to smaller than 0.1 mm; smaller than 0.2 mm; smaller than 0.3 mm.

Figure 3A:
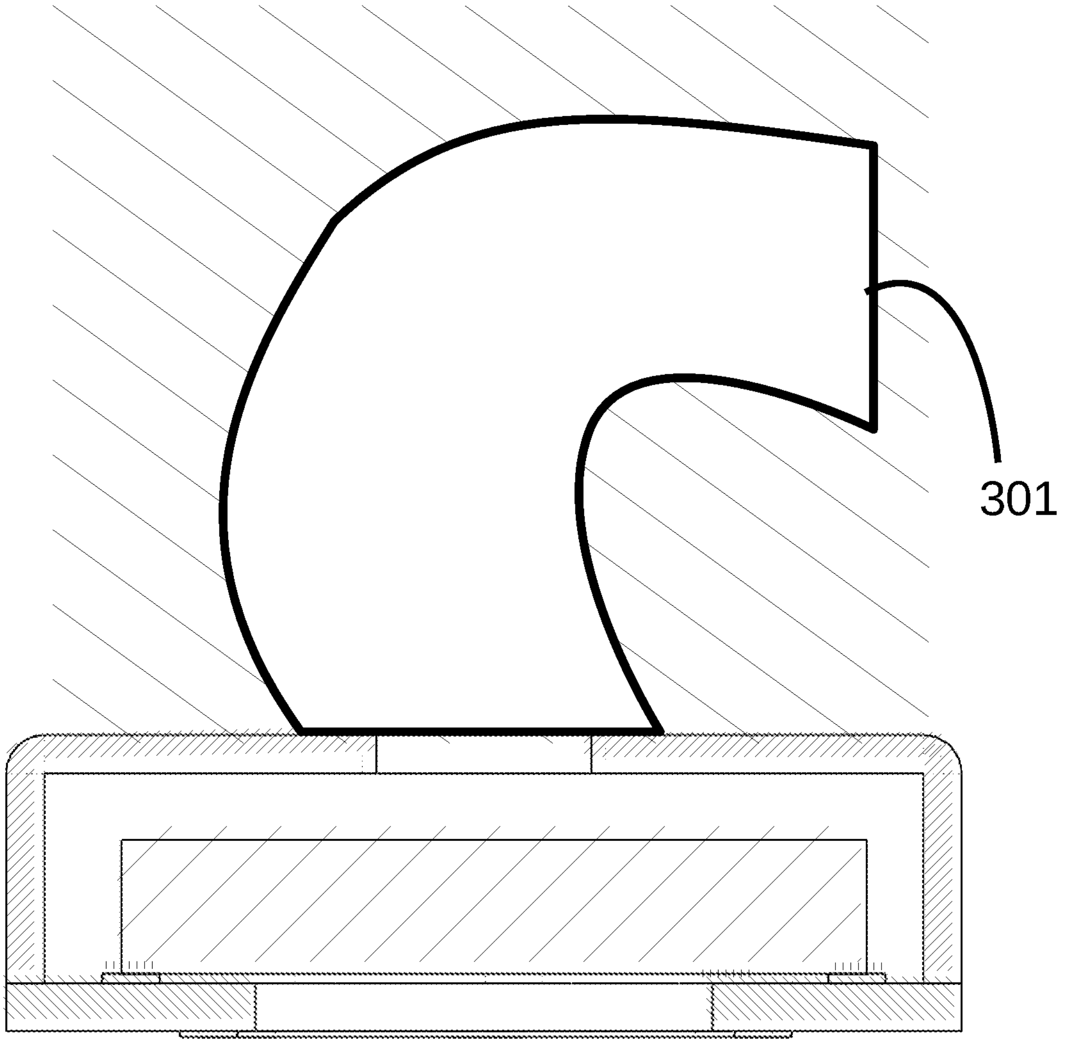
FIG. 3A is an example of a speaker device with an acoustic filter connected to a front port.

FIG. 3A is an example of a speaker device with an acoustic filter (301) connected to a front port. In some examples acoustic filter (301) and acoustic cavity are used interchangeably. In some examples, the acoustic signal generated by the speaker device needs to be filtered by one or more acoustic filters. In one example an acoustic filter has one or more resonances at any of but not limited to lower than 300 Hz; lower than 1 KHz; lower than 3 KHz; lower than 6 KHz or combinations of these. In an alternative example the acoustic filter is comprised of one or more tubes, where the combination of the tube's diameter and length and cavity volumes where cavity volumes include but are not limited to partial or total ear canal volume; speaker device air volume; cavities in acoustic element or in acoustic path. In one example a tube is designed with a diameter greater than 1 mm and length greater to provide along with the ear canal volume an acoustic resonance of 2 to 5 KHz. The speaker device is embedded in an earphone, headset, hearing aid, mobile device, speaker or other acoustic enclosure. Examples of embedding materials include but are not limited to plastic; polymer; Silicone; Metal; Aluminum; Brass; Copper; Wood; thermosetting material; thermoplastic material; injection molded material or combinations of these. An acoustic filter or filter structure is realized as cavities in the embedding material. The specific shape of the cavities is designed using any of but not limited to lumped element design; two port matrix networks; finite element; or computational fluid dynamics. A cavity can be comprised of air; or filled with one or more materials providing any of but not limited to acoustic resistance; ultrasound attenuation; resonant acoustic structures; waterproofing but acoustic transparent material; dustproof but acoustic transparent material; or combinations of these. In a further example a cavity is connected to an acoustic medium including but not limited to air; ear canal; headset; acoustic chamber. In a further example several speaker devices are connected to the same acoustic cavities, and the resulting acoustic signal is a combination of the acoustic signal of each speaker device and the acoustic response of the acoustic cavity. In a further example an acoustic cavity includes an acoustic port. An acoustic port is designed to optimize the transfer of an acoustic signal from the acoustic device and any of the above-described cavities to an acoustic medium. In one example, an acoustic port is a horn with an adiabatic increase in area from a small area corresponding to a speaker device or associated cavity to a larger area corresponding to a suitable low frequency target response. The horn is designed using available methods of horn design to optimize the audio spatial and frequency response. A horn can have one adiabatic transition in one dimension and a second adiabatic transition in a second dimension. In one example, the horn is designed to efficiently transform a volume velocity source or a pump speaker into a free space pressure source. The connection of the acoustic filter (301) to the front port is facilitated by any of but not limited to mechanical pressure; adhesive; polymer; Silicone; solder or combination of these.

Figure 3B:
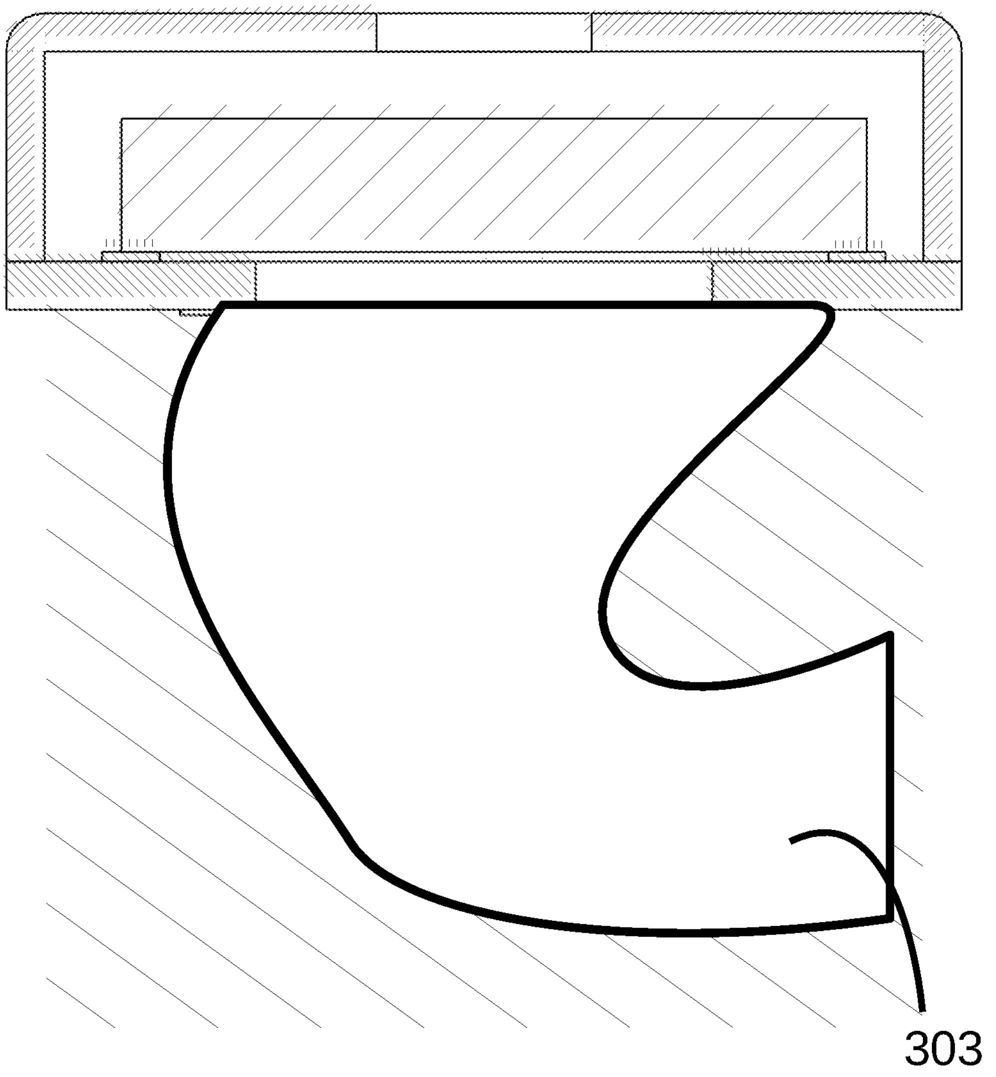
FIG. 3B is an example of a speaker device with an acoustic filter connected to the back port.
Figure 3C:
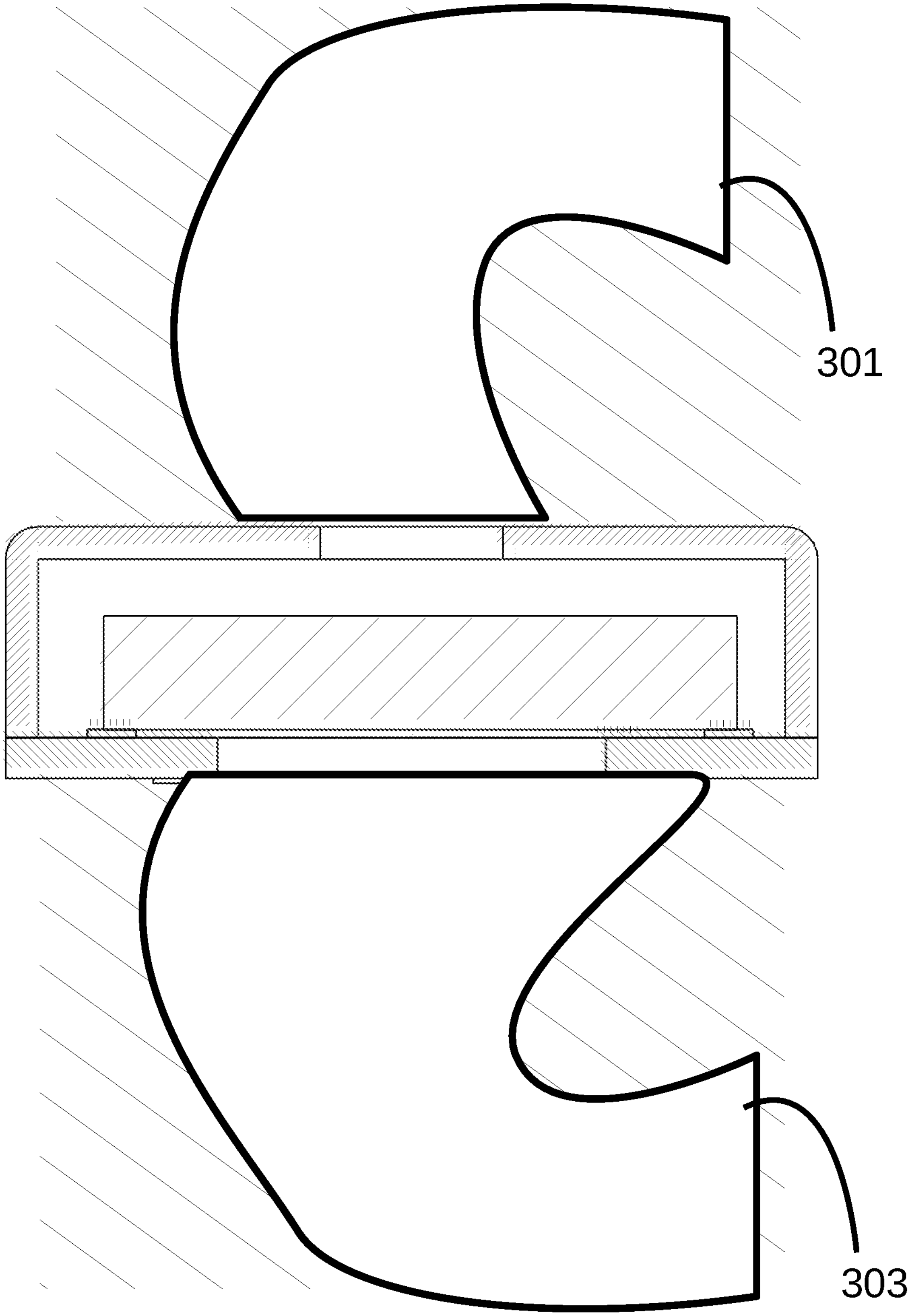
FIG. 3C is an example of a speaker device with acoustic filters connected to both front and back ports.

FIG. 3B is an example of a speaker device with an acoustic filter (303) connected to the back port and FIG. 3C is an example of a speaker device with acoustic filters (301, 303) connected to both front and back ports. The speaker device is characterized in that the air flow from one port is the opposite of the air flow in the second port. In acoustic term, the acoustic signal from one port is 180° in respect to the second port. n a further example the acoustic response of one port and corresponding acoustic filter has a resonance lower than the acoustic response of second port and corresponding acoustic filter. The two filter outputs are combined to obtain a "bass reflex" system, where the low frequency response of the system is obtained above the lower resonance of the output port since above resonance the phase shifts by 180° making both ports in phase. At higher frequencies, the port with lower resonance is attenuated and the port with higher resonance dominates. In a further example an acoustic cavity includes an acoustic port. An acoustic port is designed to optimize the transfer of an acoustic signal from the acoustic device and any of the above-described cavities to an acoustic medium. In one example, an acoustic port is a horn with an adiabatic increase in area from a small area corresponding to a speaker device or associated cavity to a larger area corresponding to a suitable low frequency target response. The horn is designed using available methods of horn design to optimize the audio spatial and frequency response. A horn can have one adiabatic transition in one dimension and a second adiabatic transition in a second dimension. In one example, the horn is designed to efficiently transform a volume velocity source or a pump speaker into a free space pressure source. The connection of the acoustic filter (301) to the front port is facilitated by any of but not limited to mechanical pressure; adhesive; polymer; Silicone; solder or combination of these.

Figure 4A:
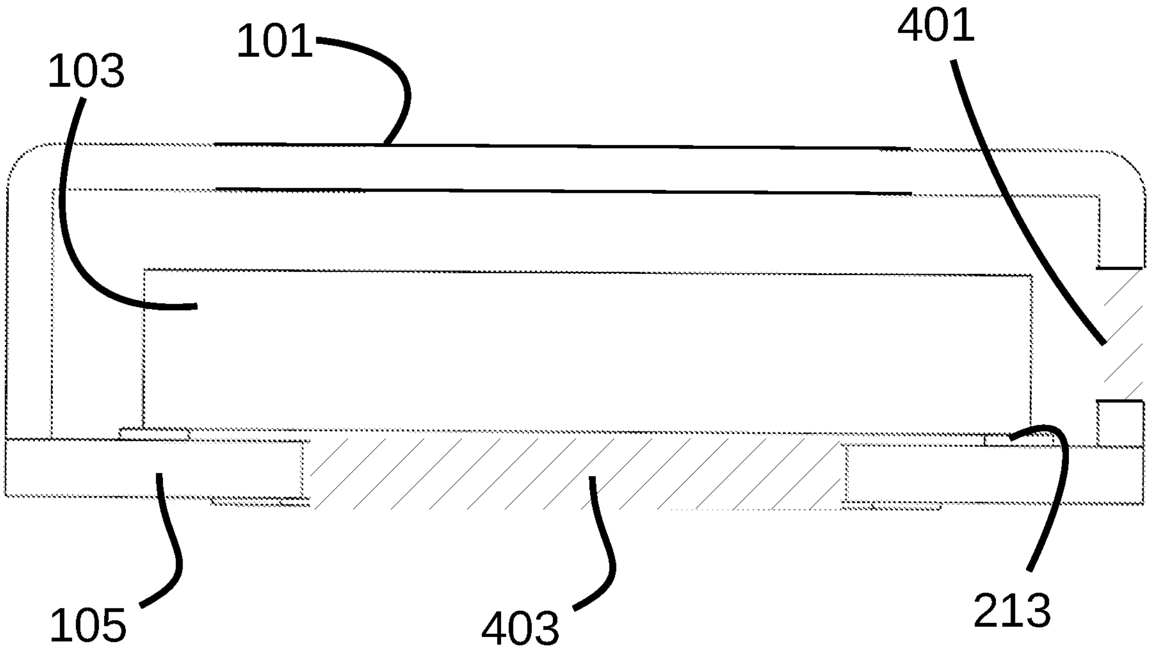
FIG. 4A is an example of a speaker device with a side and bottom acoustic port.

FIG. 4A is an example of a speaker device with a side acoustic port (401) and bottom acoustic port (403). In one example one or more side acoustic ports (401) replace or augment a top port (FIG. 2C 230). In one example an acoustic side port (401) is defined by cutting, drilling or griding using any of but not limited to laser; mechanical element; water drill. In one example a side acoustic port (401) is defined prior to forming the lid, and the shape of the port is any of but not limited to rectangular; square; ellipsoid; circular; or combinations of these. In one example an acoustic side port introduces challenges in cutting the assembled speaker device due to water seepage. To resolve these further structures are defined on the substrate. Examples of structures include but are not limited to acoustically transparent yet waterproof or water resistant, structures or structures and materials. In a further example, a structure is defined at one or more sides the package. Examples of structures include a wire frame; a molded frame; adhesive glue line. In a further example a structure includes one or more acoustic ports. The top lid attaches to the structure leaving the side acoustic port (401) connecting between the inside of the speaker device package and the external surroundings outside the speaker device package.

Figure 4B:
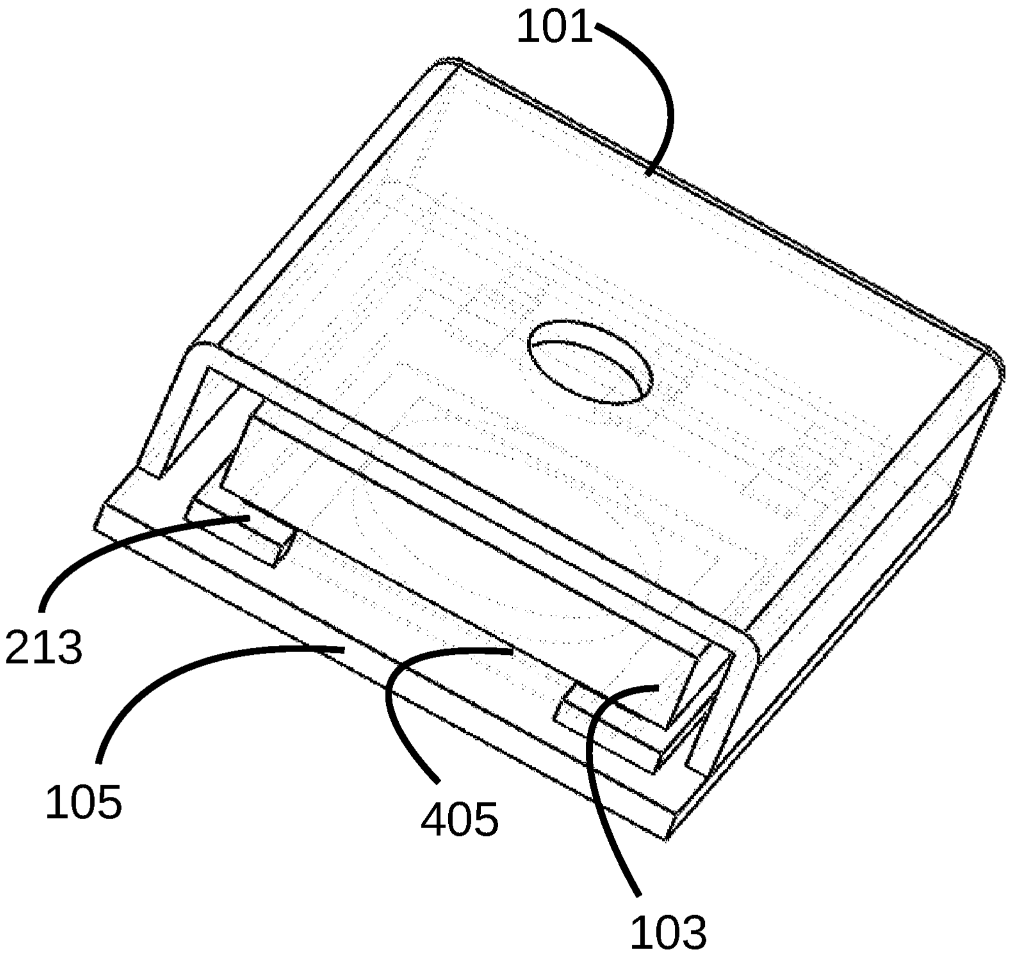
FIG. 4B is an example of a speaker device with one or more liner acoustic ports.

FIG. 4B is an example of a speaker device with one or more liner acoustic ports (405) in the top trace (213). In one example a liner acoustic port (405) is configured by a method including; creating a top trace (213); etching a liner acoustic port (405) in the top trace (213). In an alternative method, a liner acoustic port (405) is configured by a method including; creating a top trace (213) with recesses for a liner acoustic port (405). In one example the acoustic port is configured when the MEMS speaker unit (103) is attached the top trace (213) creating the top of the liner acoustic port. In a further example the liner extends until the lid (101) and the lid attaches above the liner defining a side output port (FIG. 4A 401). In a further example when using a liner acoustic port there is no bottom acoustic port (FIG. 4A 403). In another example other means create two or more cavities each connected to an output port, in between the lid (101) and substrate (105) where the bottom side of the MEMS speaker unit (103) is acoustically connected to one cavity and one acoustic port and the top side of the MEMS speaker unit (103) is acoustically connected to a second cavity and a second acoustic port. In a further example either bottom side and or top side of MEMS speaker unit (103) is segmented so that geometrically distinct areas of the acoustic ports of the MEMS speaker unit (103) are acoustically connected to different acoustic cavities and acoustic ports.

Figure 5A:
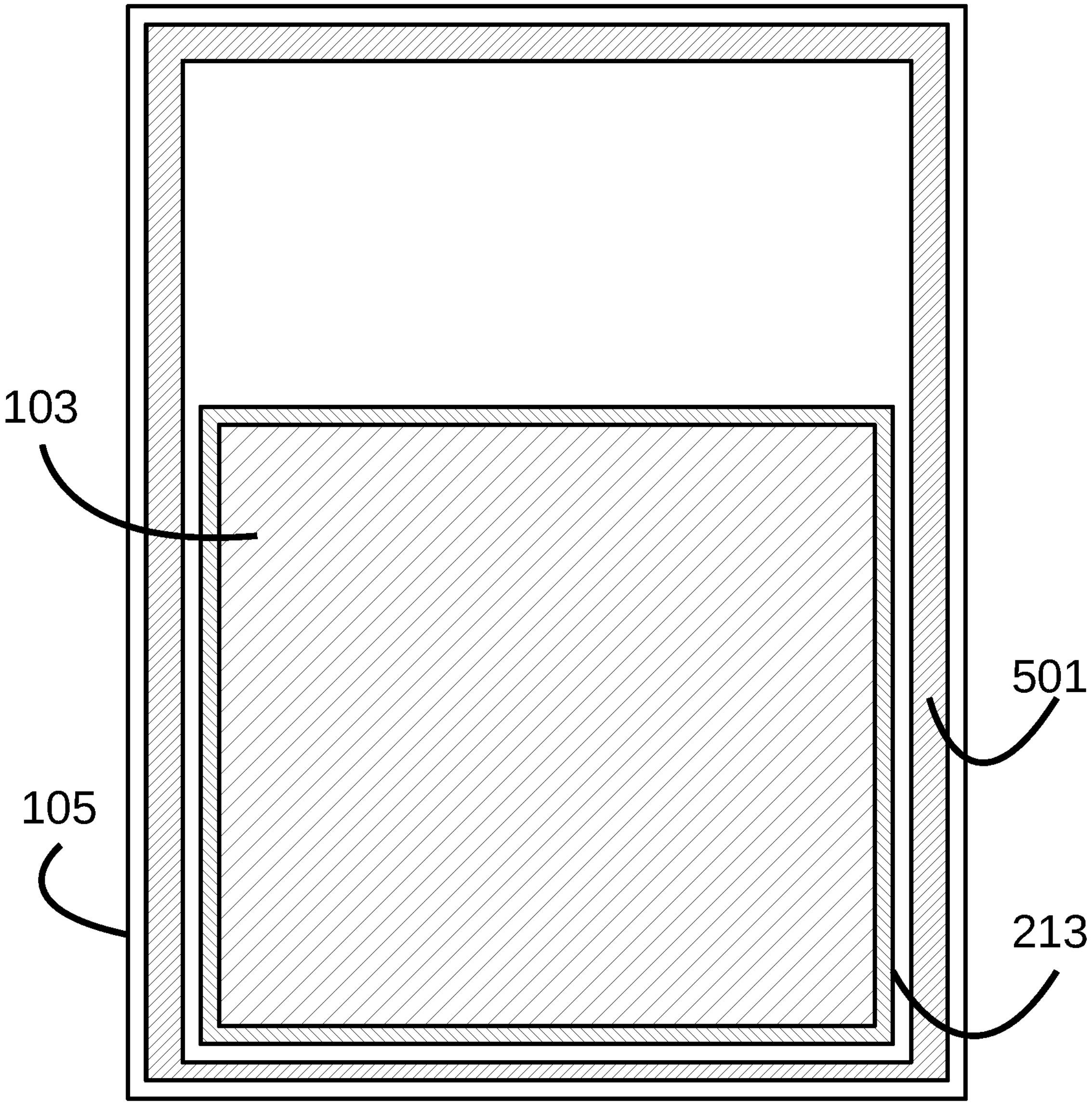
FIG. 5A is a further example of top view of a speaker device without a lid with a MEMS speaker unit.
Figure 5B:
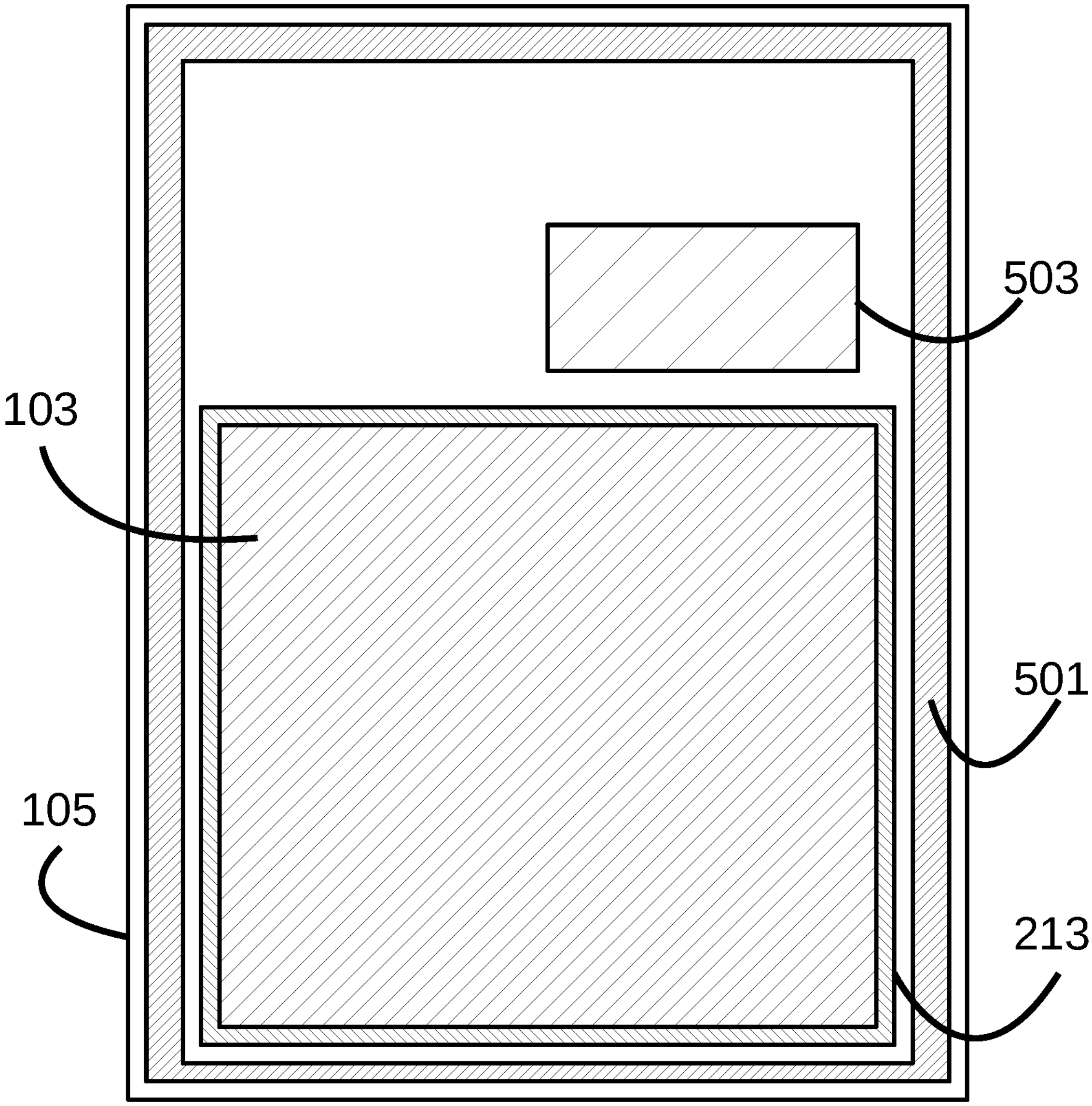
FIG. 5B is a further example of top view of a speaker device without a lid with a MEMS speaker unit, and drive ASIC.
Figure 5C:
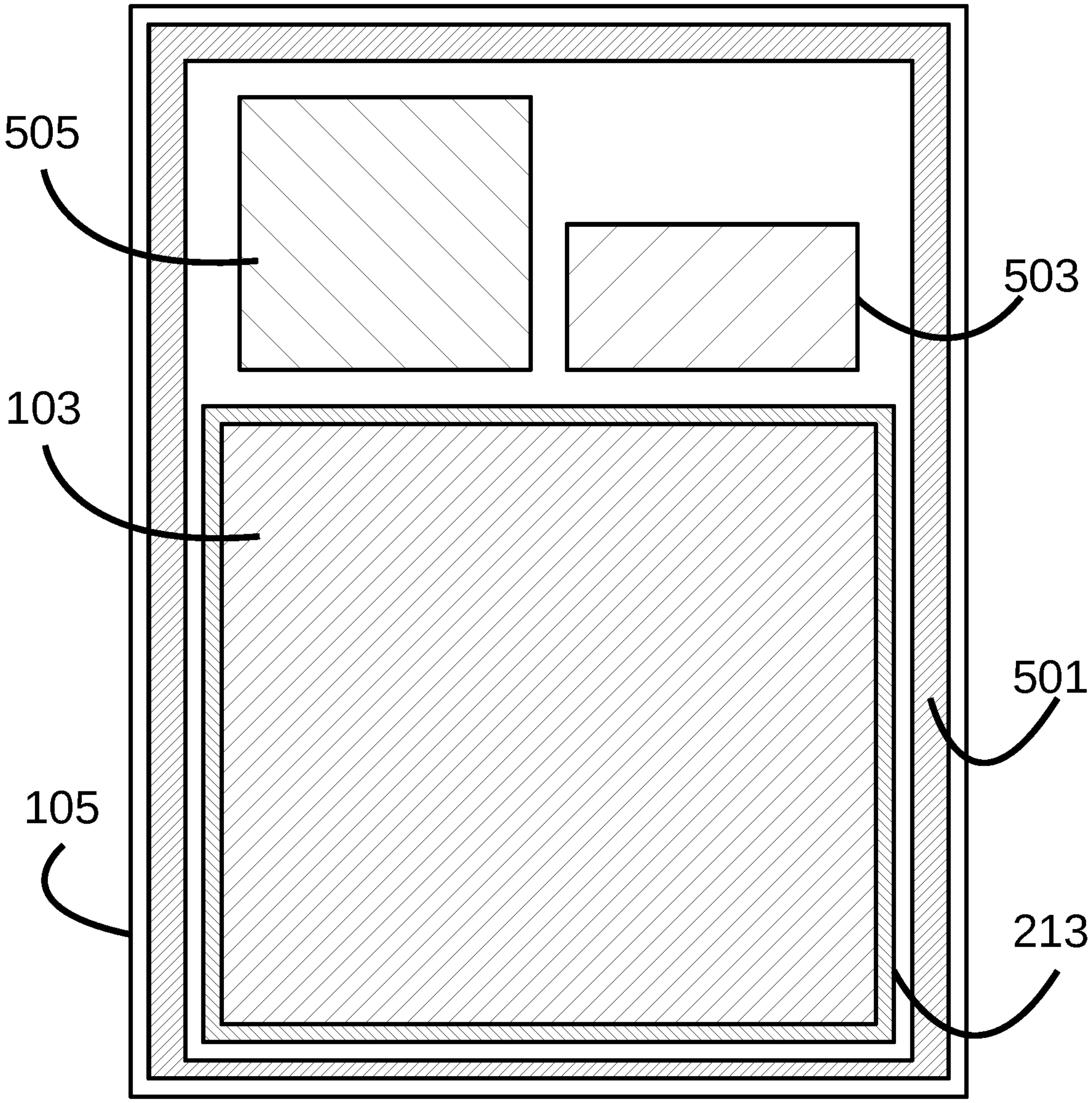
FIG. 5C is a further example of top view of a speaker device without a lid with a MEMS speaker unit, drive ASIC and additional devices.

FIG. 5A is an example of a top view of a speaker device without a lid. MEMS speaker unit (103) is attached to top trace (213) which is attached to the substrate (105). Lid trace (501) is created with top trace (213) or independently and provides a marking and attach platform for the lid. Bond pads as depicted in FIG. 2 are not shown to simplify the drawing. FIG. 5B is a further example of top view of a speaker device without a lid which in addition to MEMS speaker unit (103) includes a drive ASIC (503). The drive ASIC (503) (application specific integrated circuit) is an electronic device receiving power and control signals to operate the MEMS speaker unit. The drive ASIC (503) includes one or more bond pads for input and out electrical connection. In one example the drive ASIC (503) is configured as a WLCSP and attached through the bond pads to the substrate. In another example the drive ASIC (503) is a "bare die" with top side bond pads. In this example the MEMS speaker unit (103) is wire bonded to the drive ASIC (503) and the drive ASIC (503) is wire bonded to the substrate. FIG. 5C is a further example of top view of a speaker device without a lid which in addition to MEMS speaker unit (103)

and drive ASIC (503) additional devices (505) are included in the speaker device. Examples of additional devices include but are not limited to a MEMS microphone; MEMS accelerometer; MEMS inertial unit (IMU); passive or active electronic components such as inductors; capacitors; resonant devices; resistors; or transformers; MEMS pressure sensor; MEMS anemometer.

Figure 6A:
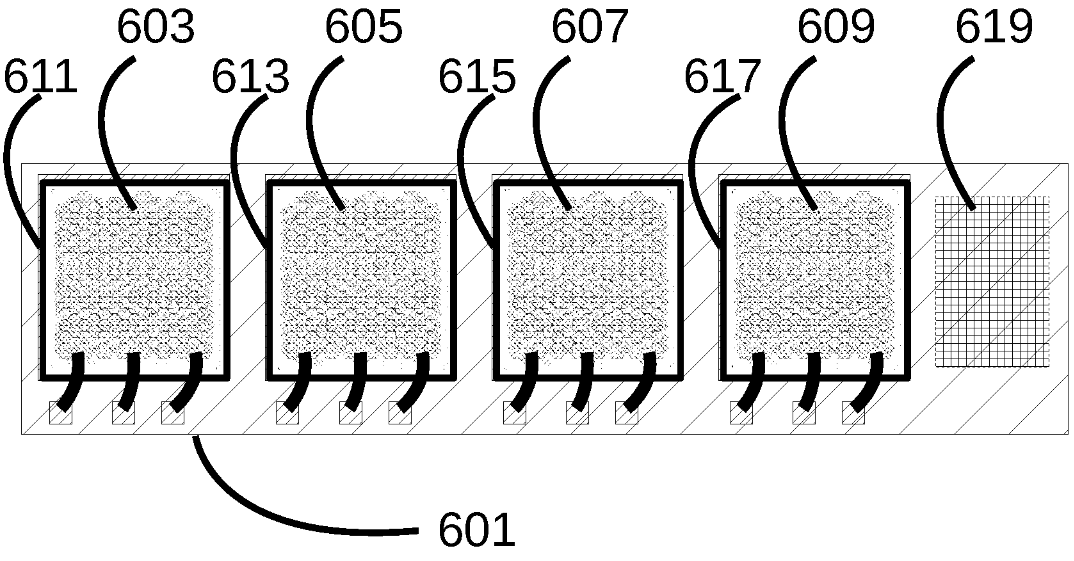
FIG. 6A is an example of a top view of a speaker device with two or more MEMS speaker units assembled on a substrate with a top lid removed.

FIG. 6A is an example of a top view of a speaker device with two or more MEMS speaker units assembled on a substrate with a top lid removed. The speaker device is comprised of; two or more MEMS speaker units (603, 605, 607, 609); a substrate (601); an acoustic filter (619). In a further example, a MEMS speaker unit (603, 605, 607, 609) is assembled on a substrate (601) using either epoxy, solder or eutectic bonding. In an alternative further example, the substrate (601) includes mechanical support (613, 615, 617, 619). In one example the mechanical support (613, 615, 617, 619) is the same as a top side trace (FIG. 2 213) which is deposited on the substrate (601) and tracing the circumference of a MEMS speaker unit (603, 605, 607, 609). In one example the top side trace (613, 615, 617, 619) extends at least any of but not limited to at least 10 microns; at least 50 microns; at least 100 microns; to either side of the MEMS speaker unit (603, 605, 607, 609) circumference. The top side trace (213) is composed of any of but not limited to metal; copper; copper alloys; solder mask; epoxy; adhesive; polymer; thermosetting polymer; Silicone or combinations of materials or layers of these. As described in FIG. 2, bond pads (FIG. 2 201, 203, 205) are deposited on the substrate adjacent to each MEMS speaker unit (603, 605, 607, 609). Each MEMS speaker unit (603, 605, 607, 609) is electrically connected with a wire bond to one or more band pads with a wire bond. In a further example the acoustic filter (619) incudes any of but not limited to; a tube with area A, and length L; one more tube sections (1 to N) each section with a length $L_x$ and area $A_x$ where x is between 1 and N inclusive; one or more membranes with an area $A_m$ and resonance frequency $f_{mx}$; one or more Helmholtz resonators with resonance frequency $f_{Hx}$; or combinations of these. In a further example, a lid covers the substrate from the top side and the volume of air enclosed in the lid combined with the acoustic filter (619) generate a combined acoustic frequency response transforming the MEMS speaker unit (603, 605, 607, 609) output to the desired acoustic response. In one example the acoustic filter functions as a bass reflex filter and is designed with a resonant frequency including but not limited to; above 20 Hz; above 50 Hz; above 100 Hz; above 300 Hz; above 500 Hz; above 1 KHz; 3 KHz or combinations of these frequencies.

Figure 6B:
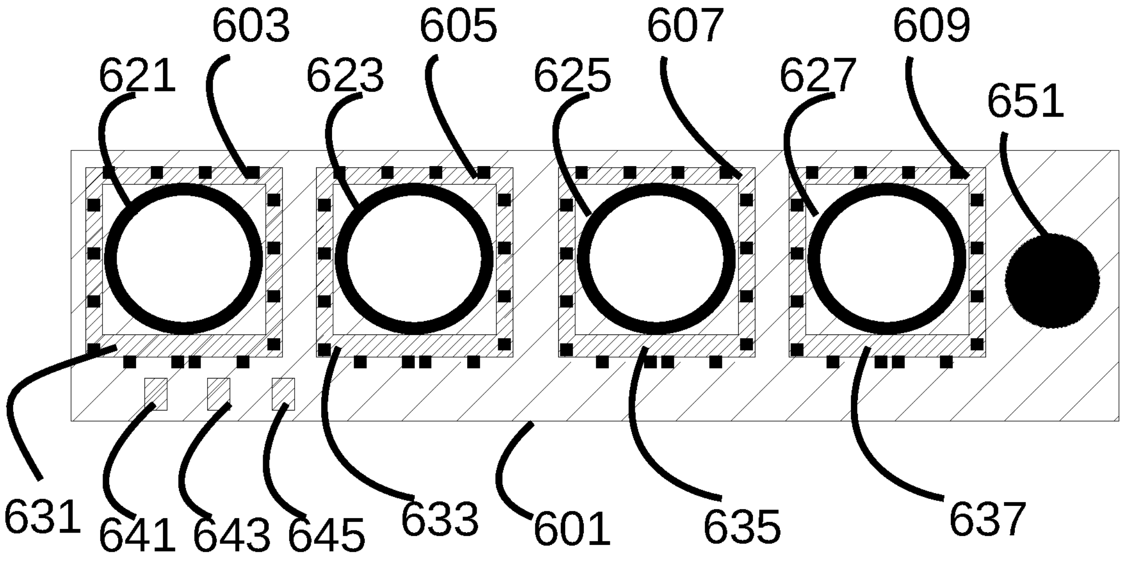
FIG. 6B is an example of a bottom view of a speaker device with two or more MEMS speaker units assembled on a substrate.

FIG. 6B is an example of a bottom view of a speaker device with two or more MEMS speaker units (FIG. 6A 603, 605, 607, 609, shown as dashed traces) assembled on a substrate. A speaker device is further comprised of a substrate (601), electric pads (641, 643, 645), acoustic port (621, 623, 625, 627) each individually or collectively acoustically coupled to a MEMS speaker unit (FIG. 6A 603, 605, 607, 609) and a filter acoustic port (651) which is acoustically coupled to the acoustic filter (FIG. 6A 619). Bottom side of speaker device further includes one or more backside trace similar to (FIG. 2B 227). A backside trace serves as a means to bond or solder the area around an acoustic port (621, 623, 625, 627) and to seal the acoustic port (621, 623, 625, 627) to an underlying substrate or audio device. In a further example the ratio of the area of the acoustic port (621, 623, 625, 627) to the area of the MEMS speaker device is any of but not limited to at least ½; at least ¾; at least ¼; at least 0.1; at least 0.2. In one example the acoustic port (621, 623, 625, 627) shape is circular.

In summary, described in one example is a speaker device comprised of an acoustic medium; a substrate in contact with the acoustic medium; a liner disposed on substrate; a MEMS speaker unit attached to the liner, wherein the volume, defined between the MEMS speaker unit, the liner and the substrate, includes a port providing acoustic coupling between the MEMS speaker unit and the acoustic medium. In a further example the liner has a minimum thickness of 20 micron. In a further example the MEMS speaker unit generates sound from modulated ultrasound using active demodulation. In a further example the volume defined between the MEMS speaker unit the liner and the substrate is at least 0.05 $mm^3$. In an alternative example a speaker device comprised of a first acoustic medium; a second acoustic medium; a substrate in contact with at least a first acoustic medium; a liner disposed on substrate; a MEMS speaker unit attached to the liner; a lid connected to the substrate, covering the MEMS speaker unit and in contact with at least a second acoustic volume; wherein the volume, defined between the MEMS speaker unit, the liner and the substrate, includes a port providing acoustic coupling between the MEMS speaker unit and the first acoustic medium; wherein the lid includes a port providing acoustic coupling between the MEMS speaker unit and the second acoustic medium. In a further example the liner has a minimum thickness of 20 micron. In a further example the MEMS speaker unit generates sound from modulated ultrasound using active demodulation. In a further example the volume defined between the MEMS speaker unit the liner and the substrate is at least 0.05 $mm^3$. In a further example the volume defined by the lid is segregated into at least two distinct acoustic volumes and the liner includes an acoustic port coupled into at least one of the two distinct volumes.

There is little distinction left between hardware and software implementations of aspects of systems; the use of hardware or software is generally (but not always, in that in certain contexts the choice between hardware and software can become significant) a design choice representing cost versus efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to disclosures containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B.". Speaker and picospeaker are interchangeable and can be used in in place of the other.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A speaker device comprising:

a first acoustic medium;

a second acoustic medium;

a substrate in contact with the acoustic medium;

a liner disposed on the substrate; and a MEMS speaker unit attached directly to the liner, wherein a volume defined between the MEMS speaker unit, the liner and the substrate, includes a first port providing acoustic coupling between the MEMS speaker unit and the first acoustic medium, a lid connected to the substrate and covering the MEMS speaker unit and in contact with at least a second acoustic volume; wherein the lid includes a second port providing acoustic coupling between the MEMS speaker unit and the second acoustic medium and at least one acoustic filter coupled to the first port or the second port, the at least one acoustic filter having at least one resonance lower than 6 KHz.

2. The speaker device of claim 1, wherein the liner has a minimum thickness of 20 micron.

3. The speaker device of claim 1, wherein the MEMS speaker unit is configured to generate sound from modulated ultrasound using active demodulation.

4. The speaker device of claim 1, wherein the volume defined between the MEMS speaker unit the liner and the substrate is at least 0.05 $mm^3$.

5. The speaker device of claim 1, where the volume defined by the lid is segregated into at least two distinct acoustic volumes and the liner includes an acoustic port coupled into at least one of the two distinct volumes.

6. The speaker device of claim 1, wherein the at least one acoustic filter has at least one resonance lower than 3 KHz.

7. The speaker device of claim 1, wherein the at least one acoustic filter has at least one resonance lower than 1 KHz.

8. The speaker device of claim 1, wherein the at least one acoustic filter has at least one resonance lower than 300 Hz.

9. The speaker device of claim 1, wherein the at least one acoustic filter is coupled to the first port.

10. The speaker device of claim 1, wherein the at least one acoustic filter is coupled to the second port.

11. The speaker device of claim 1, comprising a first acoustic filter acoustic coupled to the first port and a second acoustic filter coupled to the second port.

12. The speaker device of claim 1, wherein the at least one acoustic filter comprises a tube.

13. The speaker device of claim 12, wherein the speaker device comprises an earphone and a volume of the tube and along with an ear canal volume provides an acoustic resonance of 2 to 5 KHz.

* * * * *